United States Patent
Simon et al.

(10) Patent No.: US 10,256,830 B2
(45) Date of Patent: Apr. 9, 2019

(54) CONVERTER CIRCUIT WITH CURRENT INTERFACE AND MEASURING DEVICE WITH SUCH RESPECTIVE CONVERTER CIRCUIT

(71) Applicant: Endress + Hauser Flowtec AG, Reinach (CH)

(72) Inventors: Antoine Simon, St. Louis (FR); Francois Klein, Hagenthul de Haut (FR)

(73) Assignee: ENDRESS + HAUSER FLOWTEC AG, Reinach (CH)

( * ) Notice: Subject to any disclaimer, the term of this patent is extended or adjusted under 35 U.S.C. 154(b) by 353 days.

(21) Appl. No.: 14/652,923

(22) PCT Filed: Nov. 25, 2013

(86) PCT No.: PCT/EP2013/074632
§ 371 (c)(1),
(2) Date: Oct. 20, 2015

(87) PCT Pub. No.: WO2014/095247
PCT Pub. Date: Jun. 26, 2014

(65) Prior Publication Data
US 2016/0043730 A1    Feb. 11, 2016

(30) Foreign Application Priority Data

Dec. 21, 2012  (DE) .................. 10 2012 112 930
Jan. 28, 2013  (DE) .................. 10 2013 100 799

(51) Int. Cl.
*H03M 1/66*    (2006.01)
*H03M 1/06*    (2006.01)

(52) U.S. Cl.
CPC .......... *H03M 1/0612* (2013.01); *H03M 1/66* (2013.01)

(58) Field of Classification Search
CPC ....... H03M 1/0612; H03M 1/66; H03M 1/661
See application file for complete search history.

(56) References Cited

U.S. PATENT DOCUMENTS 5,416,723 A    5/1995  Zyl
5,481,200 A    1/1996  Voegele
(Continued)

FOREIGN PATENT DOCUMENTS

CN    1130945 A    9/1996
CN    1052306 C    5/2000
(Continued)

OTHER PUBLICATIONS

Oliveira et al., A Digitally Calibrated Current-Mode Two-Step Flash A/D Converter, 1996 IEEE, pp. 199-202.*

(Continued)

*Primary Examiner* — Toan M Le
(74) *Attorney, Agent, or Firm* — Bacon & Thomas, PLLC

(57) ABSTRACT

A converter circuit includes a current interface with a control input, with a current signal output and a current output. The converter circuit includes a micro-processor with a measuring signal input for the digital measuring signal, with a current signal input connected to the current signal output of the current interface, and with a control output connected to the control input of the current interface. The current interface lets the signal current flow through the current output and simultaneously adjust both the amperage to a stationary amperage level corresponding to a control value currently applied to the control input, and to output a sequence of current values at the current signal output. The micro-processor is designed to generate a measuring value sequence on the basis of the digital measuring signal and use it as the basis from which to generate a control value sequence and issue it at the control output as well as to (Continued)

monitor and/or check the current interface using the control value sequence and the current value sequence.

47 Claims, 4 Drawing Sheets

(56) References Cited

U.S. PATENT DOCUMENTS

| | | |
|---|---|---|
| 5,606,513 A | 2/1997 | Louwagie |
| 5,672,975 A | 9/1997 | Kielb |
| 6,014,100 A | 1/2000 | Fehrenbach |
| 6,140,940 A | 10/2000 | Klofer |
| 6,388,431 B1 | 5/2002 | Kramer |
| 6,452,493 B1 | 9/2002 | Ma |
| 6,472,884 B1 | 10/2002 | Brockhaus |
| 6,505,519 B2 | 1/2003 | Henry |
| 6,684,340 B1 | 1/2004 | Lubcke |
| 6,950,760 B2 | 9/2005 | Henry |
| 7,162,651 B2 | 1/2007 | Brockhaus |
| 7,296,482 B2 | 11/2007 | Schaffer |
| 7,336,068 B2 | 2/2008 | Muller |
| 7,630,844 B2 | 12/2009 | Lalla |
| 7,768,530 B2 | 8/2010 | Sigtermans |
| 7,778,784 B2 | 8/2010 | Lalla |
| 7,792,646 B2 | 9/2010 | Karbula |
| 8,276,458 B2 | 10/2012 | Hedtke |
| 8,332,168 B2 | 12/2012 | Mansfield |
| 8,683,366 B2 | 3/2014 | Hammer |
| 9,182,256 B2 | 11/2015 | Wehrs et al. |
| 2001/0016802 A1 | 8/2001 | Florin |
| 2010/0026322 A1 | 2/2010 | Gehrke |
| 2010/0164717 A1 | 7/2010 | Spanke |
| 2011/0062942 A1 | 3/2011 | Karbula |
| 2012/0304023 A1 | 11/2012 | Wennerberg |

FOREIGN PATENT DOCUMENTS

| | | |
|---|---|---|
| CN | 101484854 A | 7/2009 |
| DE | 10162334 A1 | 7/2003 |
| DE | 102007026244 A1 | 12/2008 |
| DE | 102007027276 A1 | 12/2008 |
| EP | 1591977 A1 | 11/2005 |
| GB | 2229897 A | 10/1990 |
| WO | 8802476 A1 | 4/1988 |
| WO | 8802853 A1 | 4/1988 |
| WO | 9420940 A1 | 9/1994 |
| WO | 9508123 A1 | 3/1995 |
| WO | 9508758 A1 | 3/1995 |
| WO | 0026739 A1 | 5/2000 |
| WO | 0048157 A1 | 8/2000 |
| WO | 0171291 A1 | 9/2001 |
| WO | 03106931 A2 | 12/2003 |
| WO | 2008000631 A1 | 1/2008 |
| WO | 2008091548 A2 | 7/2008 |
| WO | 2009002341 A1 | 12/2008 |
| WO | 2011005938 A2 | 1/2011 |
| WO | 2012009003 A2 | 1/2012 |
| WO | 2012159683 A1 | 11/2012 |

OTHER PUBLICATIONS

"Analog Devices"; Complete Closed-Loop Precision Analog Microcontroller Thermocouple Measurement System with 4 mA to 20 mA Output; "Circuits from the Lab" Reference Circuits; Circuit Note CN-0300; 2012 Analog Devices, Inc., One Technology Way, Norwood, MA 02062-9106 U.S.A.

German Search Report, German Patent Office, Munich, DE, dated Oct. 16, 2013.

International Search Report, EPO, The Netherlands, dated Mar. 10, 2014.

English Translation of the International Preliminary Report on Patentability, WIPO, Geneva, CH, dated Jul. 2, 2015.

"Complete Closed-Up Loop Precision Analog Microcontroller Thermocouple Measurement System with 4 maA to 20 mA Output", Analog Devices Circuit Note CN-0300, Oct. 1, 2012.

Abdulah Cakir et al., "Microcontroller Circuit Calibrates Current Loops", Test & Measurement World, Feb. 1, 2012.

Z. Mijanovic, R/2R+ Digital Analog Converter (DAC), IEEE Instrumentation and Measurement Technology Conference, Belgium, Jun. 4-6, 1996.

B. Catteu et al., "A Digital Calibration Technique for the Correction of Glitches in High-Speed DAC's", Ghent University, Belgium, IEEE International Symposium, May 1, 2007.

* cited by examiner

CONVERTER CIRCUIT WITH CURRENT INTERFACE AND MEASURING DEVICE WITH SUCH RESPECTIVE CONVERTER CIRCUIT

TECHNICAL FIELD

The invention concerns a converter circuit for the transformation of a digital measuring signal representing a chronological sequence of a time-dependent physical and/or chemical measurand into an analogue measure value signal that is dependent on the digital measuring signal with a signal current, with an amperage representing a measured value for the measurand. This circuit is particularly suited for use in a digital measuring transducer with analogue output signal. In addition, the invention consists of a measuring device that uses such a converter circuit as part of the construction.

BACKGROUND DISCUSSION

In industrial measuring and automation technology, especially in the context of the automation of chemical or process engineering sequences and/or the automatic control of industrial facilities, measuring units that are directly installed into the relevant facility are used, sometimes also referred to as field devices or field measuring devices, such as e.g. Coriolis' mass flow meters, density meters, magnetic inductive flow meters, vortex flow meters, ultrasound flow meters, thermal mass flow meters, pressure gauges, level meters, temperature meters, pH value meters etc, which each serve to determine measured values representing a time-dependent physical and/or chemical measurand, as well as the generation of at least one—digital or analogue measure value signal transferring such measured value outside the respective measuring device. Each measurand to be captured by the respective measuring device may, depending on the application, for example be a mass flow, a density, viscosity, a fill or limit level, pressure, pH value, electrical conductivity or a temperature or similar of a liquid, powdered, vaporous or gaseous medium that is transported or kept in an appropriate container, such as a pipe conduit or a tank. Measuring devices of this type, generally known to experts in the field, are demonstrated e.g. in European Patent EP A 1 591 977, British Patent GB A 22 29 897, US A 2001/0016802, US A 2010/0026322, US A 2011/0062942, US A 56 72 975, US A 60 14 100, US A 61 40 940, US B 64 52 493, US B 64 72 884, US B 66 84 340, US B 71 62 651, US B 72 96 482, US B 76 30 844, US B 77 78 784, US B 77 92 646, Published International Applications, WO A 00/26739, WO A 00/48157, WO A 01/71291, WO A 03/106931, WO A 2008/091548, WO A 2009/002341, WO A 2011/005938, WO A 2012/009003, WO A 2012/159683, WO A 88/02476, WO A 88/02853, WO A 94/20940, WO A 95/08123, and WO A 95/08758, or the applicant's own, not pre-published international application PCT/EP2012/057791, or are commercially offered by applicant's assignee itself, e.g. with the name t trend ATT12, Promag 53H, Prowirl 73F, Promass E 200, Promass F 200, Promass 83X, or Promass 84F.

Measuring units of the type described above are provided with an appropriate physical-electrical or chemical-electrical sensor to capture the pertinent process parameters. The sensor is usually inserted into the walls of the container for the medium, or into the conduit containing the medium, e.g. a pipe and serves to generate at least one initially analogue electrical measuring signal that corresponds to the measurand to be obtained, i.e. representing its chronological course; with said signal being further processed using a measuring device's electronics unit that is electrically connected to the transducer in such a way that relevant measured values for the measurand are obtained. The measuring device electronics unit of the respective measuring device is usually housed in a comparatively robust electronic housing protecting against shock, pressure, explosion and/or weather conditions. This housing may be placed away from the sensor and only linked to the latter via a flexible line; or it may be directly placed at the sensor or in a separate sensor housing for the sensor. The measuring device electronics unit for measuring units, such as the ones discussed here, is further during operation electrically connected via appropriate connection terminals and linked electrical connection cables with a higher-level electronic data processing system that is usually distanced in space from the relevant measuring device. Such data processing system receives the measured values generated by the respective measuring device through the measure value signal in a format it can process. In metrology, not least for the case of a transfer of measure value signals over larger distances, e.g. in a range of 10 m to a couple of hundred meters, the use of analogue electrical current signals, i.e. analogue measure value signals, for which a momentary amperage of a pre-set, but within a set measuring range, namely within a current range reserved for the transfer of measured values, variable signal current each represents exactly one measured value for the measurand. In industrial metrology, the transfer of measured values is often effected using so-called 4-20 mA current loops, therefore, such signal currents are used as measure value signals, which are variable within a lower limiting current strength set at approx. 3.8 mA—occasionally also referred to as live zero point or live zero value—and an upper limiting current strength set at approx. 20.5 mA. Amperage ranges below and above said measuring range, also e.g. defined in the DIN IEC 60381-1 standard, for 4-20 mA current loops are usually reserved for signaling previously defined special operation conditions deviating from the normal measuring operation in the normal operation mode corresponding to the measuring unit, e.g. special operating mode alarm conditions due to a measurand outside the measuring range specified for the measuring device, or due to the failure of the respective sensor, also to comply with the requirements set out in the NAMUR recommendations NE43:18.01.1994 for unified signal levels for the failure information of digital transducers with an analogue output signal.

In order to generate the measure value signal, modern measuring devices of the type discussed here first allow the generation of a digital measuring signal representing the analogue electrical measuring signal of the transducer using an analogue to digital transformer placed e.g. directly at the sensor and/or inside the electronics housing mentioned above. Further processing of the digital measuring signal for the purpose of generating digital measured values representing the relevant measurand, and for the conversion of said measured values in at least one measure value signal of the type as described above externally to the measuring system electronics, requires the measuring device electronics to include a converter circuit receiving the digital measuring signal. As, for example, also shown in the respective US A 2001/0016802, US A 2010/0026322, US A 2011/0062942, US B 76 30 844, US B 77 92 646, US B 77 78 784, US B 64 52 493, and US A 60 14 100, Publication International Application WO A 95/08123 or WO A /009003 referred to initially, said converter circuits in modern measuring devices of the type discussed here usually consist of a digital micro-processor containing one, occasionally more than one processor and/or a digital signal processor (DSP); with said micro-processor receiving the digital measuring signal via a measuring signal input. The micro-processors are, inter alia, arranged in such a way as to generate a sequence of measured values, i.e. sequence representing a chronological line of the measurand for digital measured values, each one representing a momentary measurand at different times.

For the case that the measure value signal is to be output as an analogue current signal, said converter circuit also shows a current interface controlled by the micro-processor with at least one current output and a control input that is designed to let the signal current flow through the current output while adjusting both its amperage to a stationary amperage level corresponding to the momentary control value at said control input as determined by the micro-processor for the appropriate control output in such a way that each of the stationary amperage level depends on a respective control value according to a characteristic curve function inherent to the current interface by the operation parameters of the electronic components constituting the current interface. The current interface may take the form of a passive interface, i.e. an interface inserting a current in the sense of a load modulation provided by an supply circuit outside of the measuring device, or an active interface, i.e. an interface varying a current provided by an internal supply circuit in the measuring device. Inside the micro-processor, there is furthermore a respective appropriate calculation rule determined by at least two pre-set coefficients which defines how to calculate each of the control values of the control value sequences depending on the digital measuring values of the measured value sequence. The calculation rule is usually a linear function or polynomial function of polynomial degree One determined by exactly two coefficients. On the whole, the converter circuits of the type discussed here thus have a characteristic converter curve determined by the said calculation rule and the characteristic curve function inherent in the current interface that transforms each of the measured values into a respective current amperage level, or according to which a measurand within each pre-set measuring range is projected onto the signal current.

Usually, such current interfaces are made using a linear current controller and an upstream digital-to-analogue transducer to convert the digital control value into a respective analogue one for the signal current to be adjusted. The linear current controller captures the momentary amperage level in such a setup via the falling analogue measuring voltage at a measuring resistor the signal current flows through. As further shown in WO A 95/08123 referred to above, the current interfaces may also include a current signal output by the analogue to digital converter that digitalizes said measuring voltage. At this is output a sequence of current values, i.e. a sequence of digital current values representing the respective amperage at different moments in time which, in turn, represent the chronological sequence of the actually set current strength of the signal current. Via a current signal input on the micro-processor appropriately connected to said current signal output, the digital current values can be read by the micro-processor and processed further, e.g. to determine a relationship between a terminal voltage measurable between two connected terminals each linked with a connecting lead outside the measuring unit carrying the signal current during operation, and the actually set amperage for the signal current via the current interface.

Measuring devices of the type discussed here must occasionally be checked after initial start-up, especially with regard to a calibration adjustment—be it on the instructions of the operator running the measuring device and/or on the order of the regulatory authority supervising the measuring center the measuring device is part of—to see whether the required measuring accuracy or the one stated in the specifications, i.e. that accuracy with which the measurand eventually is projected onto the measure value signal, is still reliably reached. The respective current interface also receives special attention when measuring devices of the type discussed here are checked. This is not least done because one regularly has to assume that the characteristic curve function currently assigned to the current interface that is the basis of the signal value amperage in relation to the appropriate control value at any moment may actually deviate from the characteristic curve function originally set at the respective current interface at an earlier time, e.g. during manufacturer calibration or during measuring device set-up due to ageing. The current interface is traditionally checked by looping a current measuring device, e.g. a digital ampere meter into the circuit made by the current interface in such a way that the respective measuring device may also carry the signal current, and the micro-processor then executes an appropriate testing program triggered by an appropriate start command which transfers a group of previously defined test control values to the current interface one by one and generates a corresponding sequence of amperage levels. Usually, also those control values are used as testing control values that correspond to the limit amperage of the lower range limit and/or the upper range limit, so for example correspond to control values for 4 mA or 20 mA respectively. The actually set stationary amperage level in relation to the current testing control value is precisely measured in each case using the current measuring device and then displayed accordingly. For documentation purposes of the test, the testing control values can also be saved together with the respective measuring values for actually set amperage levels also with a digital recording unit which may, for example, be directly connected to the current measuring device or implemented in it. Similarly, the testing control values respectively set by the micro-processor on the measuring device may be displayed and/or transferred to the digital recording unit for storage—which communicates with the micro-processor at least for this case using an appropriate service interface in the measuring device electronics.

The measuring values determined by the current measuring device for the individual amperage levels are then compared to the current readings with their respective testing control value in such a way as to determine any deviation of the actually set stationary amperage level to the respective testing control value. Should all deviations remain within a pre-set tolerance range, and thus no significant deviation of the current characteristic curve function to the original one at the current interface is determined, the check of the respective current interface may be regarded as passed, otherwise an appropriate realignment of the converter circuit may be required. Such a realignment may be completed for traditional converter circuits e.g. by reading the measuring values for the different amperage levels into the micro-processor, e.g. by manual input via a connected keyboard or by direct reading from the above-mentioned recording unit, and the micro-processor then calculates a new set of replacement coefficients for the calculation rule based on the respective measuring values, the corresponding testing control values and the coefficients saved in the micro-processor. As a consequence, the calculation rule is modified as the replacement coefficients are then used for the calculation rule in place of the original coefficients. The modification of said calculation rules may also be effected for traditional measuring devices by first reading the measured values for the amperage levels, the corresponding testing control values together with the coefficients saved in the micro-processor first using a portable computer, a laptop or tablet computer that is ready outside the measuring unit, if necessary via a service interface or radio interface, and then the respective replacement coefficients are calculated to then in turn be transferred to the micro-processor of the converter circuit.

One disadvantage of traditional measuring device electronics of the type discussed above, or the converter circuits implemented in them is that normal measuring operations of the measuring unit must be interrupted to check its current interface, i.e. the measuring site in the supervised facility part must be down for the duration of the control process. In addition, such checks require a usually very expensive current measuring unit which in turn also has to be calibrated regularly, i.e. a very special testing means. Another disadvantage in the traditional measuring device electronics of the type discussed above, or their respective converter circuits in this context is also that firstly checking the current interface requires considerable manual handling of the respective measuring system consisting of the measuring device subject to the check and the data processing system linked to it, in this case the temporary looping of the current measuring unit that is an essential element of the check, and that secondly the recurring modification of the calculation rule for the control values require other special testing means in the shape of a suitable communicating recording unit and/or a computer that is programmed accordingly, and thus considerable additional technical efforts.

SUMMARY OF THE INVENTION

In order to take this into account, one of the tasks for the invention is to improve measuring device electronics of the type discussed here, and thus measuring devices using such electronics in such a way that said checking of the current interface is possible using on-board test equipment, i.e. means provided by the measuring device electronics, and consequently without further manual intervention into installed measuring devices, i.e. ones that are connected to a higher-level data processing system via connecting cables or without special external test equipment, and if possible also without any long interruptions or normal measuring operations.

In order to solve this problem, the invention consists of a converter circuit that serves to transform a digital measuring signal representing the chronological sequence of a physical and/or chemical measurand that can be modified over time—e.g. within a pre-set measuring range—into an analogue measuring value signal with a signal current one amperage of which represents a measuring value for the measurand. The converter circuit for this purpose consists of a current interface with a control input, a current signal output and a current output as well as a micro-processor with a measuring signal input for the digital measuring signal, a current signal input connected to the current signal output of the current interface and a control output connected to the control input of the current interface. The converter circuit according to the invention also includes a current interface that may let the signal current flow through the current output while adjusting both the amperage of the signal current to a stationary amperage value corresponding to a control value currently applied to the control input in such a way that each of the stationary amperage meters depends on a corresponding control value according to a characteristic curve function immanent in the current interface—for example linear—as well as outputting a sequence of current values at the current signal output, i.e. a sequence of digital current values obtained for different points in time representing the momentary amperage which represents a chronological sequence of the amperage for the signal current.

Furthermore, a converter circuit according to the invention is set to generate a sequence of measuring values based on the digital measuring signal at the measuring signal input, i.e. a sequence representing a chronological sequence of the measurand for digital measuring values obtained at different moments in time which represent the measurand at that moment, and based on the this sequence of measured values a sequence of control values, specifically a sequence of digital control values for the current interface and output it at the control output, as well as based on the control value sequence and the current value sequence—e.g. based on at least temporarily saved control values and at least temporarily stored digital current values—to monitor and/or test the current interface.

In addition, the invention consists of a measuring system that comprises: a sensor to capture a physical and/or chemical measurand—e.g. within a pre-set measuring range—that changes over time, and to generate at least one analogue measuring signal representing the chronological sequence of said measurands, as well as the measuring device electronics that is electrically connected to the sensor—e.g. housed in an electronics case—which is setup to transform the analogue measuring signal into a digital measuring signal that represents a chronological course of the measurand in question, and that this comprises a converter circuit.

In a first embodiment of the converter circuit according to the invention, the micro-processor is arranged to check the current interface based on the control value sequence and the current value sequence—e.g. based on at least temporarily saved control values and at least temporarily saved digital current values—and thus determine any deviation between a control value and at least one corresponding digital current value; and/or determine to what extent said current value deviates from the control value; and/or determine a current characteristic curve function that helps the current interface to adjust the stationary amperage levels with regard to the digital control values; and/or determine whether or to what extent a current characteristic curve function used by the current interface to adjust the stationary amperage levels in relation to the digital control values deviates from the characteristic curve function previously determined for the current interface.

In a second embodiment of the converter circuit according to the invention, provision is made for the current interface to have a release input and the micro-processor a release output connected with said release input of the current interface, and the current interface is furthermore designed to issue the current value sequence at the current signal output once a control command activating the current signal output is applied to the release input, or the micro-processor is designed to generate a control command to activate the current signal output and issue it at the release output. In this embodiment of the invention further provision is made for the current interface to temporarily not output a current value sequence at the current signal output—e.g. if the control command activating the current signal output is not received or once a control command generated by the micro-processor that deactivates the current signal output is applied to the release input. This may, for example, also occur in such a way that an activation time, i.e. the cumulated total time over a pre-set operation period during which the current interface issues the current value sequence at the current signal output, is shorter than a deactivation time, i.e. the cumulated total time over a pre-set operation period during which the current interface does not issue the current value sequence at the current signal output.

In a third embodiment of the converter circuit according to the invention, said invention is designed to be operated temporarily—e.g. mainly—in a normal operation mode in which the measurand only changes temporarily within a pre-set measuring range for this purpose with a lower limit threshold defined by the pre-set minimum measuring value for the measurand and a pre-set upper measuring value threshold for the maximum limit threshold, and during which the micro-processor only issues such control values at the control output that cause the current interface to adjust the amperage of the signal current in such a way that the stationary amperages are each within a measuring range that is pre-set for this value, i.e. have a first limit amperage corresponding to the measuring range pre-set for the measurand, and thus corresponding to its lower range threshold as well as a second limit amperage that differs from the first limit amperage and corresponds to its upper range threshold.

The first limit amperage may in this case be e.g. 4 mA or less, esp. more than 3.6 mA, and/or the second limit amperage may in this case be e.g. 20 mA or more, esp. less than 21 mA.

In a fourth embodiment of the converter circuit according to the invention this is further designed—e.g. caused by a malfunction of the converter circuit or the digital measuring signal and/or caused by a measurand outside the measuring range and/or caused by an unacceptably high deviation from at least one of the stationary amperage levels from the pre-set control value—to at least part of the time operate in a special operation mode, during which the micro-processor issues such control values at the control output, esp. exclusively, that cause the current interface to adjust the amperage of the signal current in such a way that the stationary amperage levels are outside the pre-set measuring range.

In a fifth embodiment of the invention, the micro-processor is designed to determine a converter error based on the control value sequence and the current value sequence—e.g. based on saved control values and saved digital current values.

In a sixth embodiment of the invention, the converter circuit is designed to at least occasionally check, based on the sequence of control values and the sequence of current values, whether a stationary amperage level corresponds to the respective pre-set control value and/or to what extent a stationary amperage level deviates from the control value set for it.

In a seventh embodiment of the invention, the micro-processor is designed to determine the control values of the control value sequence based on a calculation rule determined by at least two pre-set, currently valid coefficients as the functional value of an esp. linear function of at least one of the digital measuring values (XD,j) of the sequence of measuring values. Further developing this embodiment of the invention, the micro-processor is furthermore designed to compare, based on the control value sequence and the current values sequence—e.g. based on saved control values and saved digital current values—said calculation rule with a current characteristic curve function according to which the current interface adjusts the stationary amperage levels subject to the digital control values—e.g. in such a way that a deviation of the current characteristic curve function from a previously determined characteristic curve function for the current interface is compensated. Further developing this embodiment of the invention, the micro-processor is designed to occasionally—e.g. when a deviation of a stationary amperage level from the control value pre-set for it or a deviation of a current characteristic curve function used by the current interface to adjust the stationary amperage levels subject to the digital control values from a characteristic curve function previously determined for the current interface—calculate at least one replacement coefficient for at least one of the currently valid, but to be replaced coefficients. For this purpose, provision is made that the converter circuit—e.g. previously operated in a problem-free normal operation mode—is temporarily run in a special operating mode—automatically and/or controlled by the micro-processor or via a control command externally transmitted to it because of which the micro-processor issues—e.g. exclusively—such control values that cause the current interface to adjust the amperage of the signal current in such a way that the stationary amperage levels are outside the pre-determined measuring range and by the micro-processor determining the replacement coefficient—e.g. in such a way that for the identification of at least one replacement coefficient at least two different control values are issued by the micro-processor, at least one of which causes the current interface to adjust the amperage of the signal current in such a way that the respective stationary amperage level remains below a minimum limit amperage set for this measuring range and/or at least one of which causes the current interface to adjust the amperage of the signal current in such a way that the respective stationary amperage level remains above a maximum limit amperage set for a measuring range.

In an eighth embodiment of the invention, the micro-processor is designed to determine the control values of the control value sequence as a linear function of one of the digital measuring values of the measuring value sequence, i.e. based on a polynomial function of polynomial degree N−1=1 governed by two precisely predetermined, currently valid coefficients.

In a ninth embodiment of the invention the converter circuit is designed to be operated in a start-up mode which allows for the micro-processor to first be started and then, i.e. during start-up mode, test the current interface. As a further development of this embodiment of the invention, provision is further made for the micro-processor to test the current interface during start-up mode by issuing a live-zero-control value at the control output, i.e. a control value that causes the current interface to adjust the amperage of the signal current in such a way that the respective stationary amperage level corresponds to a live-zero-value, i.e. an amperage indicating the live zero point of the converter circuit. There is further made provision for the micro-processor to test the current interface during start-up mode by issuing a control value at the control output—e.g. at a later time—that differs from the live-zero-control value and which causes the current interface to adjust the amperage $I_x$ of the signal current in such a way that the respective stationary amperage level corresponds to a current value above the live-zero-value—e.g. to an alarm current value of more than 20.5 mA and less than 23 mA. Based on the life-zero-control value, at least one digital current value corresponding to said live-zero-control value, the control value deviating from the live-zero-control value at at least one digital current value corresponding to such control value, the micro-processor may test the current interface during start-up mode by identifying a current characteristic curve function used by the current interface to adjust the stationary amperage levels subject to the digital control values and comparing it with a characteristic curve function input for that purpose and/or identifying both a deviation between the live-zero-control value and the corresponding digital current value and a deviation between the other control value deviation from the live-zero-control value and the corresponding digital current value and then determining whether each of the two identified deviations is within or outside a pre-determined tolerance range representing acceptable deviations.

In a first further development of the converter circuit according to the invention, provision is further made for it to include a persistent data memory. Furthermore, the micro-processor may be designed to save, e.g. at least one corresponding digital current value and/or a deviation between a current value and a corresponding digital current value in a non-volatile data memory, potentially together with a time indication corresponding to the time of saving.

In a second further development of the converter circuit according to the invention, provision is further made for it to include a volatile data memory to save digital measuring values and/or digital control values. The micro-processor may further be designed to temporarily store digital control values and digital current values in the data memory.

In a first further development of the measuring device according to the invention, the measuring device electronics furthermore includes a display element controlled by the micro-processor to display measured values generated by the micro-processor and to display a pair of values consisting of a current value and a control value and/or a deviation of a current value from a control value and/or to display a transducer error.

In a second further development of the measuring device according to the invention, the measuring device electronics include a first connection terminal that is designed to be electrically combined with a first connecting line placed outside the converter circuit, as well as a second connection terminal that is designed to be electrically combined with a second connecting line placed outside the converter circuit. Further developing this embodiment of the invention, provision is further made for the current output of the current interface to feature two connecting electrodes, of which connecting electrodes a first connecting electrode is connected electrically to the first connecting terminal and a second connecting electrode is connected to the second connecting terminal.

In a third further development of the measuring device according to the invention, the measuring device—electronics include a first connection terminal designed to be electrically connected with a first connecting line placed outside the converter circuit; a second connection terminal designed to be electrically connected to a second connecting line placed outside the converter circuit; a third connection terminal designed to be electrically connected to a third connecting line place outside the converter circuit; and a fourth connection terminal designed to be electrically connected to a fourth connecting line placed outside the converter circuit.

In a fourth further development of the measuring device according to the invention, the measuring device electronics comprise an energy supply circuit with an input and at least one output, said energy supply circuit being designed to supply a useful voltage at said output to operate the micro-processor and/or to operate the current interface. Further developing this embodiment of the invention, the energy supply circuit is furthermore designed to carry at least a part of the signal current and use it to supply the useful voltage to operate the micro-processor and/or operate the current interface.

In a fifth further development of the measuring device according to the invention, the measuring device electronics include an energy supply circuit with an input and at least one output, said energy supply circuit being designed to provide a useful voltage at said output to operate the micro-processor and/or the current interface, and the measuring device electronics comprise a first connection terminal designed to be electrically connected to a first connecting line placed outside the converter circuit; a second connection terminal designed to be electrically connected to a second connecting line placed outside the converter circuit; a third connection terminal designed to be electrically connected to a third connecting line placed outside the converter circuit; as well as a fourth connection terminal designed to be electrically connected to a fourth connecting line placed outside the converter circuit; with the voltage input of the energy supply circuit having two connection electrodes, a first connecting electrode of this is connected to the third connection terminal and a second connecting electrode connected to the fourth connection terminal.

One basic idea for the invention is that the current interface of measuring device electronics of the type discussed here, and/or the measuring devices using them are tested each by generating an occasional digital current value, i.e. measuring value representing a momentarily set current level of the signal current during operation of the respective measuring devices from the current device for the actually set current level—e.g. automatically and/or triggered by a respective control command—and that this is transmitted to the micro-processor, and that via the micro-processor—e.g. once more automatically and/or caused by a respective control command—said digital current value is compared to the pre-set control value previously transmitted to the current interface to thus identify possible modifications of the characteristic curve function inherent in the current interface and accordingly, the resulting changes for the characteristic converter curve of the respective converter circuit as early as possible. The invention is also based on the surprising discovery that the analogue-to-digital converter required to determine the digital current values may have a much higher long-term stability with regard to its specific values determining the accuracy of the signal change than the specific values of the current controller determining the characteristic curve function of the current interface and eventually adjusting the signal current to the amperage level set by the micro-processor. On the other hand, possible discrepancies between the measuring values determined for the measurand and the eventually adjusted stationary amperage level can be mainly put down to the transfer behavior of said current controller over time and/or changes in the transfer behavior of the upstream digital-to-analogue converters, but not to a similarly notable drifting of the analogue-to-digital converter which appears as time-invariant in comparison to the former, which makes it usable as a reference or comparison standard for the actually set stationary amperage level.

Although then a realization of the control circuit created using the current interface to adjust the amperage level of the signal current continues to be done or must be done using components from analogue technology, such as operational amplifiers, transistors etc. not least due to the very fast reaction times usually required (or the reverse high dynamics), a possible drifting of the current interface now can be discovered very quickly and very reliably using the micro-processor that uses "on board" testing devices, and may also be compensated for by appropriately adjusting the calculation rule for the control values. Furthermore, the usual inspection intervals between the re-calibration occasionally still required using external testing means for converter circuits according to the invention, e.g. to comply with regulatory requirements, can be extended considerably compared to the same inspection intervals for traditional converter circuits.

In case the micro-processor serves to discover a deviation between said digital current value and the corresponding control value that is outside a given tolerance range, this may also be signaled accordingly, e.g. visually as a quantitative value via a display on the measuring device operated by the micro-processor, e.g. using an appropriate alphanumeric plain text display and/or as a qualitative value, e.g. using a color-coded and/or a blinking lamp. It is furthermore possible to conduct a new calculation of the coefficients used for the calculation rule applied to the generation of the control values in case the deviation between current value and control value is too high and thus requires a readjustment of the converter circuit via the micro-processor, i.e. based on the value pairs for digital current value and corresponding control value generated for this purpose, in such a way that the changes, e.g. due to ageing, in the characteristic curve function for the current interface are compensated by the restructured calculation rule, and/or an early re-calibration of the respective converter circuit with external testing means may be automatically arranged.

While the above-mentioned test (calibration) of the current interface or the converter circuit integrating it would also be possible without problems "on the fly", i.e. during regular measuring operations, it may occasionally be necessary to switch from the normal operation mode of the measuring device to a special operation mode in case a re-adjustment of the converter circuit were required, e.g. in such a way that the microprocessor in such mode only issues control values at the control output that cause the current interface to adjust the amperage of the signal current to amperage levels outside the given measuring range, e.g. also in the range reserved for signaling alarm conditions that are nevertheless different from each other.

BRIEF DESCRIPTION OF THE DRAWINGS

The invention as well as other advantageous embodiments of it are in the following explained using some design examples shown in the figures of the drawing. The same parts are labeled with the same reference sign in all figures; for reasons of clarity or if it appears sensible for other reasons, reference signs used before are not repeated in the following illustrations. Further advantageous embodiments or further developments, esp. combinations of partial aspects of the invention that were originally explained separately may be derived from the illustrations in the drawing and from the sub-claims themselves. The figures show in detail:

DETAILED DISCUSSION IN CONJUNCTION WITH THE DRAWINGS

Figure 1:
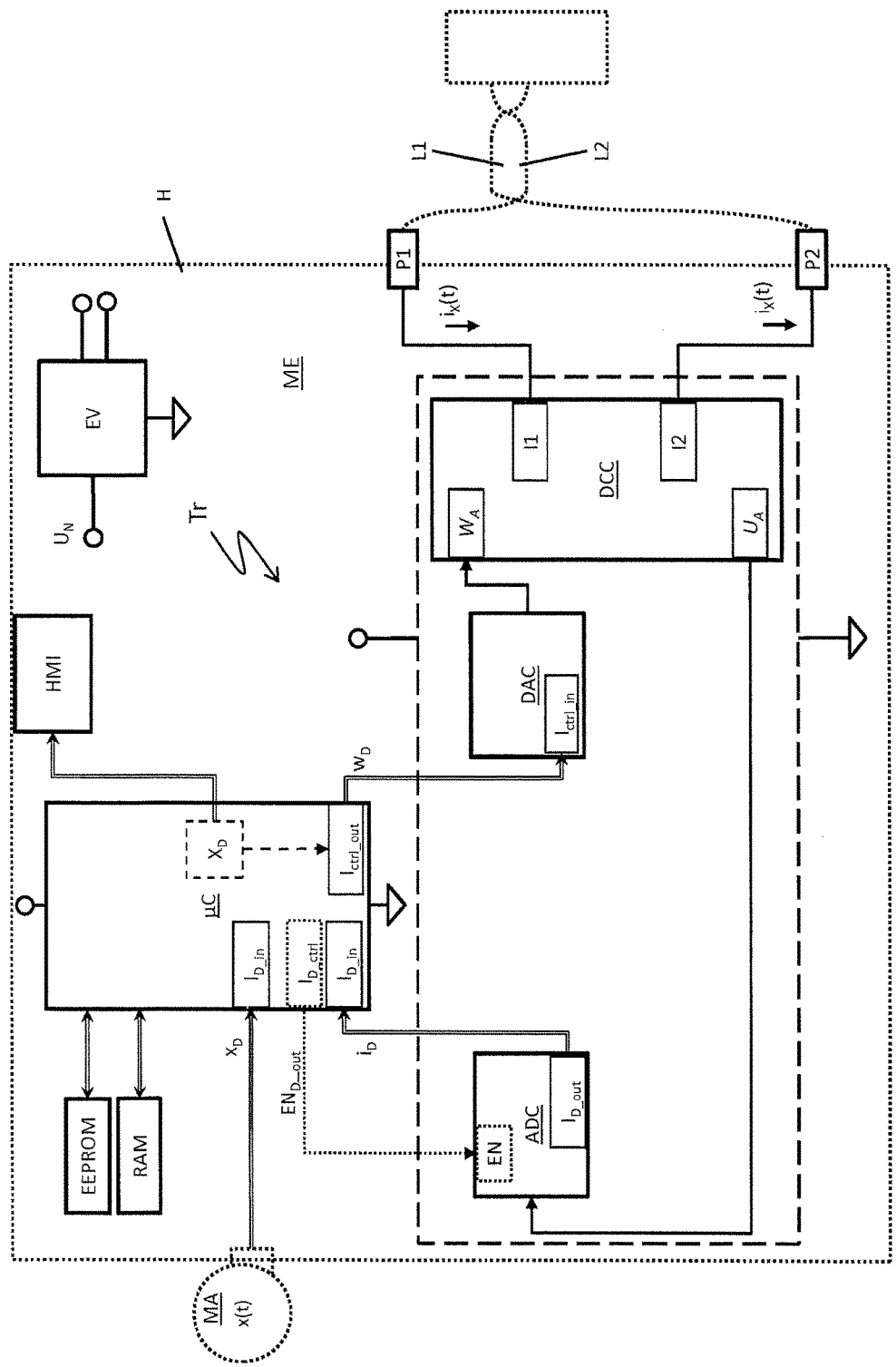
FIG. 1 shows a schematic representation of a converter circuit with a current interface controlled by a microprocessor, suitable esp. for a measuring device in industrial measuring and automation technology.

FIG. 1 shows a schematic representation of an embodiment of a measuring device esp. suitable for use in industrial measuring and automation technology with a sensor MA and electrically connected measuring device electronics ME, electronic in that they are made at least in part using semiconductors, as a block diagram. The measuring device electronics ME are advantageously housed in an appropriate electronics housing H, esp. to protect them against shock and/or explosions and/or seal them hermetically and/or in a modular design. For example, the electronic housing H may be placed away from the sensor or, as indicated schematically in FIG. 1, be fixed directly to the measuring sensor MA, e.g. on the outside of a housing for the sensor MA, thus forming one single compact device.

The measuring device MA serves to capture a physical and/or chemical measurand x subject to changes over time, e.g. the density, viscosity, a temperature and/or the pressure of a fluid, a volume flow rate or a mass flow rate of a fluid flowing in a conduit, esp. a pipe or a chute, or the fill level of a medium, esp. a liquid or bulk material in a container, esp. a tank or a basin as well as to generate at least one measuring signal that represents the temporal course of the measurand x—initially as an analogue measuring signal, which is then transformed into a digital measuring signal representing it, i.e. the temporal course of said measurand x, using the measuring device electronics ME, and then is evaluated in order to generate a digital measuring value $X_D$ to represent the measurand x. The measurand x itself is naturally subject to change over time in such a way that it changes during fault-free operation of the measuring point the respective measuring device is part of, specifically only within a measuring range $\Delta x_{12}$ given for the measuring point and/or the respective measuring device; with the measuring range extending from a given smallest measuring value for measurand x determining the lower range threshold $x_1$ and a given highest measuring value for measurand x determining the upper range threshold $x_2$. Any measurand outside the measuring range would accordingly be regarded as a fault in the measuring point.

The measuring electronics ME are furthermore intended to generate an analogue measuring value signal with a signal current based on the digital measuring signal and/or the measuring values derived from this, with said signal current amperage $I_x$ representing a measuring value X for the measurand; this in particular in such a way that a stationary amperage level $I_{x,j}$ for the amperage $I_x$ each falling within a measuring span $\Delta I_{12}$ given for this purpose. The measuring span $\Delta I_{12}$ in this case corresponds to the measuring range $\Delta x_{12}$ given for the measurand x and, therefore, has a first limit amperage $I_1$ corresponding to the lower range threshold value $x_1$ and a second limit amperage $I_2$ naturally is not identical to limit amperage $I_1$ and corresponds to the upper range threshold value $x_2$. The smaller of the two limit amperages $I_1$, $I_2$ here occasionally also corresponds to the live zero point of the converter circuit and is occasionally referred to as live zero value. The measuring value signal may, for example, correspond to a 4 mA 20 mA current signal frequently used in industrial measuring and automation technology, and therefore be a signal current flowing in a signal circuit including the measuring device electronics whose limit amperage $I_1$ is 4 mA or lower, but ideally more than 3.6 mA, and whose limit amperage $I_2$ is 20 mA or higher, but ideally less than 21 mA. Amperage levels outside the measuring span may further serve to signal special operating modes, esp. also alarm conditions caused by malfunctions.

In order to convert the digital measuring signal $x_D$ to the analogue measuring value signal, the measuring device electronics ME includes a converter circuit Tr—e.g. in the form of a digital measuring converter with analogue output signal as per the NAMUR recommendation NE43: 18.01.1994 mentioned above—with a current interface DCC and a micro-processor µC controlling the current interface and receiving the digital measuring signal $x_D$ at a measuring signal input. The micro-processor µC is, among other functions, designed to generate a sequence of measuring values at its measuring value input based on the digital measuring signal xD, namely a sequence representing a temporal course of the measurand for different points in time $t_i$, the sequence consisting of digital measuring values $X_{D,i}$, each momentarily representing the measurand in turn.

The measuring values generated using the converter circuit Tr can be displayed directly on site, i.e. directly at the measuring point or in the immediate vicinity. To visualize measuring values generated inside the measuring device and/or system status messages generated inside the measuring device, such as an error message or a warning on site, the measuring device may, for example, be equipped with a display or a display-and-handling element HMI communicating with the measuring device electronics, esp. controlled by the micro-processor and/or portable, such as an LCD, OLED or TFT display with a corresponding input keypad or a touchscreen in the electronic housing behind a window for this purpose. In a favorable way the measurement device electronics, also as a version to be remotely parametrized, may furthermore be designed in such a way that it exchanges measuring and/or other operating data during the operation of the measuring device with a higher-level electronic data processing system, e.g. a programmable logic controller (PLC), a personal computer and/or a workstation using a data transmission system, e.g. an Ethernet, a field bus and/or wireless radio connection, possibly in real time, among such data current measuring and/or system diagnosis values or adjustment values needed to control the measuring device. Furthermore, the measuring device electronics ME also have an energy supply circuit EV with an input featuring two connection electrodes and at least one output that serves to provide at such output a useful voltage $U_N$ to operate the current interface DCC and/or the micro-processor µC, thus for the operation of the measuring device electronics it is part of, and/or appropriate useful electrical voltage for, the measuring device electronics. Said energy supply circuit is fed by an external source of energy.

Figure 2:
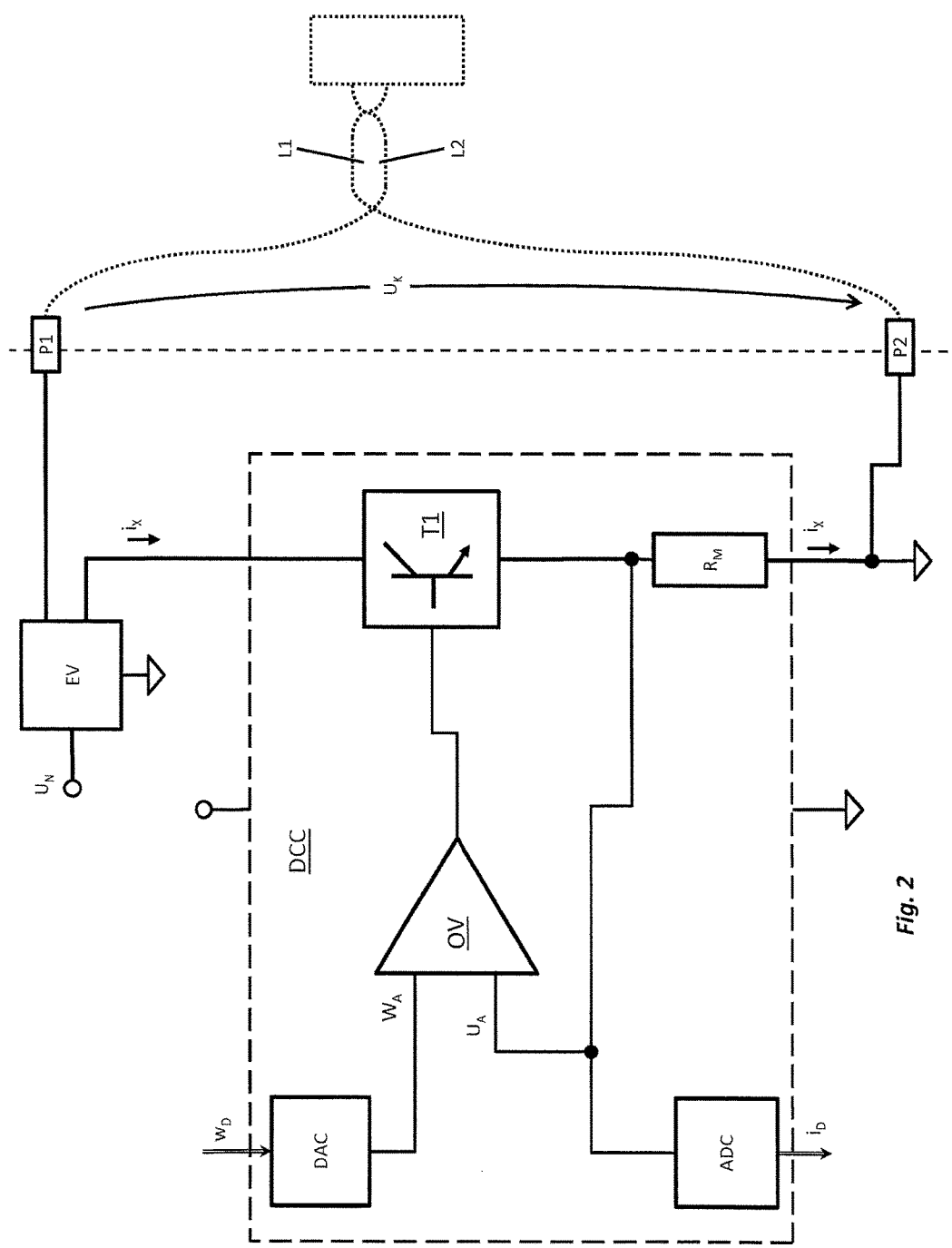
FIGS. 2, and 3 show a schematic representation of a variant of a measuring device in industrial measuring and automation technology with a converter circuit as per FIG. 1.

The current interface DCC in turn has a current output for the signal current, a control input $I_{ctrl\_in}$ and a current signal output $I_{D\_out}$ and is designed to let the signal current flow through the current output during operation while both adjusting the amperage of the signal current to a momentarily applied control value $W_{D,j}$ applied to the control input $I_{ctrl\_in}$ corresponding to the stationary amperage level $I_x$ and issuing a current value sequence $i_D$ at the current signal output $I_{D\_out}$. The current value sequence $i_D$ is a sequence of digital current values $I_{D,j}$ determined for different, e.g. also equidistant (scanning) times $t_j$ representing the amperage and/or the respective set amperage level $I_x$ and thus illustrates the temporal course of the signal current $i_x$. As shown schematically in FIGS. 2 and 3, the current interface, as is usual for measuring devices of the type discussed here, may consist of a transistor T1 controlled by an operation amplifier OV, e.g. a bipolar transistor or a field effect transistor and a measuring resistor $R_M$ that carries the entire signal current during operation and delivers a proportional measuring voltage $U_A$ for the operation amplifier, thus a linear current controller that here is exclusively realized in analogue technology. The measuring voltage $U_A$ is furthermore brought to an analogue input of an analogue to digital converter ADC featuring a digital output which in turn serves to realize the current signal output $I_{D\_out}$ of the current interface DCC. The control input $I_{ctrl\_in}$ for the current interface DCC may, as schematically illustrated in FIG. 2 and/or FIG. 3, for example be constructed using a digital to analogue converter DAC that is integrated into the current interface and receives the current control value $W_{D,j}$ at a digital input and converts it into a corresponding analogue DC voltage $W_A$ at an analogue output for the above-mentioned current controller. The digital to analogue converter DAC may, for example, be a 1 bit converter using a counting technique, i.e. using an arithmetic mean of a touch level of a pulse-width modulated square-wave voltage corresponding to the current control value $W_{D,j}$ as its analogue DC voltage WA.

Figure 3:
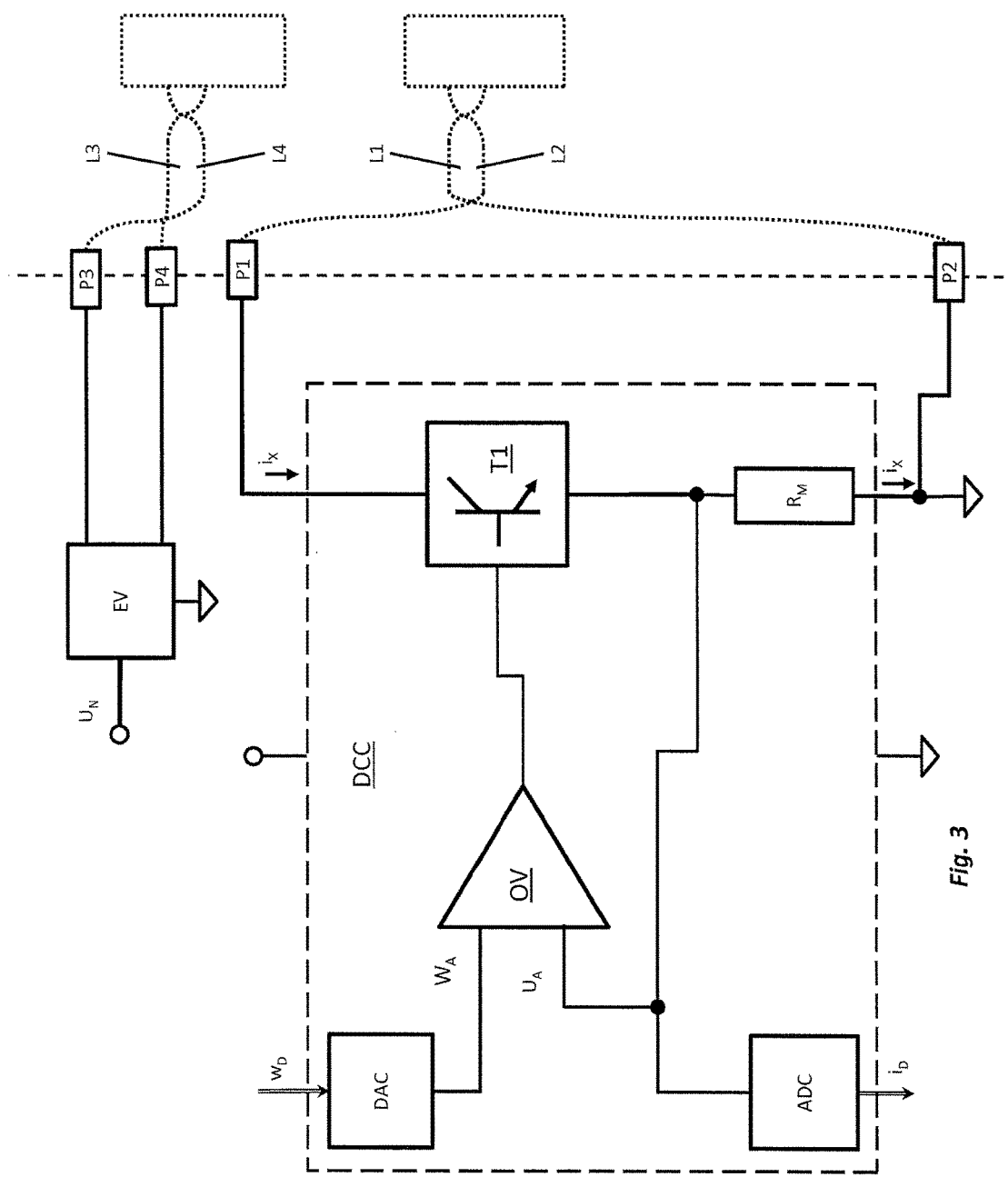

In order to include the converter circuit Tr, and thus the measuring device it is part of, into a signal current circuit eventually carrying the signal current, the converter circuit Tr features a first connecting terminal P1, as well as a second connecting terminal P2. Both connecting terminals P1 and P2 are designed to be electrically connected with one of two connection lines L1 and L2 respectively that are placed outside the converter circuit. Furthermore, the current output of the current interface features two corresponding connection electrodes, the first of which I1 is electrically connected to the connecting terminal P1 (and hence with connection line L1) and another connection electrode I2 is electrically connected to the connecting terminal P2 (and hence with connection line L2). The measuring device may take the form of a so-called two-wire measuring device, i.e. a measuring device that is only supplied with electrical energy via the two connecting cables L1, L2 and only connected to an external electronic data processing system via the two connecting lines L1, L2, in such a way that the energy supply circuit EV as schematically shown in FIG. 2, is directly electrically connected to at least one of the two connecting electrodes P1, P2 and the required electrical useful voltage needed for operating the measuring device electronics, including the sensor electrically connected to it is drawn from an electrical voltage supplied by the signal current $i_x$ as well as the terminal voltage $U_K$ applied on the connecting terminals P1, P2. The energy supply circuit EV is furthermore adjusted in a further embodiment of the invention to carry at least a part of the signal current and use it to provide the useful voltage $U_N$. As an alternative, the measuring device may also take the shape of a so-called four-wire measurement device in such a way that the internal energy supply circuit EV for the measurement device electronics ME as shown schematically in FIG. 3 is connected to an external energy supply using an additional pair of connecting lines L3, L4 and the electrical power required for the operation of the measuring device electronics, including the sensor electrically connected to it is drawn from those connecting lines L3, L4 which do not carry the signal current $i_x$ during operation. For this purpose the measurement device electronics in another embodiment of the invention feature a third connecting terminal P3 in addition to the two mentioned connecting terminals P1, P2, the third terminal being designed to be electrically connected with a third connecting line L3 placed outside the converter circuit, as well as a fourth connecting terminal P4 that is designed to be electrically connected to a fourth connecting line L4 placed outside the converter circuit. In addition, in this embodiment, the voltage input of the energy supply circuit is connected to a first connection electrode at the connection terminal P3 and a second connection electrode at the connection terminal P4. Whereas in the latter case the current interface DCC may be incorporated as a passive or an active interface, in the other case, namely that the measuring device is designed as a two-wire measuring device, the current interface DCC is passive.

In order to control the current interface DCC, in the micro-processor μC there is furthermore the provision of a connected to its control input $I_{ctrl\_in}$, e.g. via the control output $I_{ctrl\_out}$ and the micro-processor is furthermore designed to generate a control value sequence $w_D$ on the basis of the measuring value sequence, i.e. a sequence of digital control values $W_{D,j}$ for the current interface, for which control values $W_{D,j}$ each respectively represents a momentary amperage level adjusted using the current interface DCC and issued at the control output $I_{ctrl\_out}$. In order to save the digital measuring and/or control values generated during operation, the micro-processor μC is furthermore connected with a volatile data memory RAM in the converter circuit. Sequence programs controlling the micro-processor, not least computational programs serving to generate the nominal value sequence or parts thereof are furthermore saved in a second persistent data memory EEPROM in the converter circuit Tr which can be read and written by the micro-processor μC.

Figure 4:
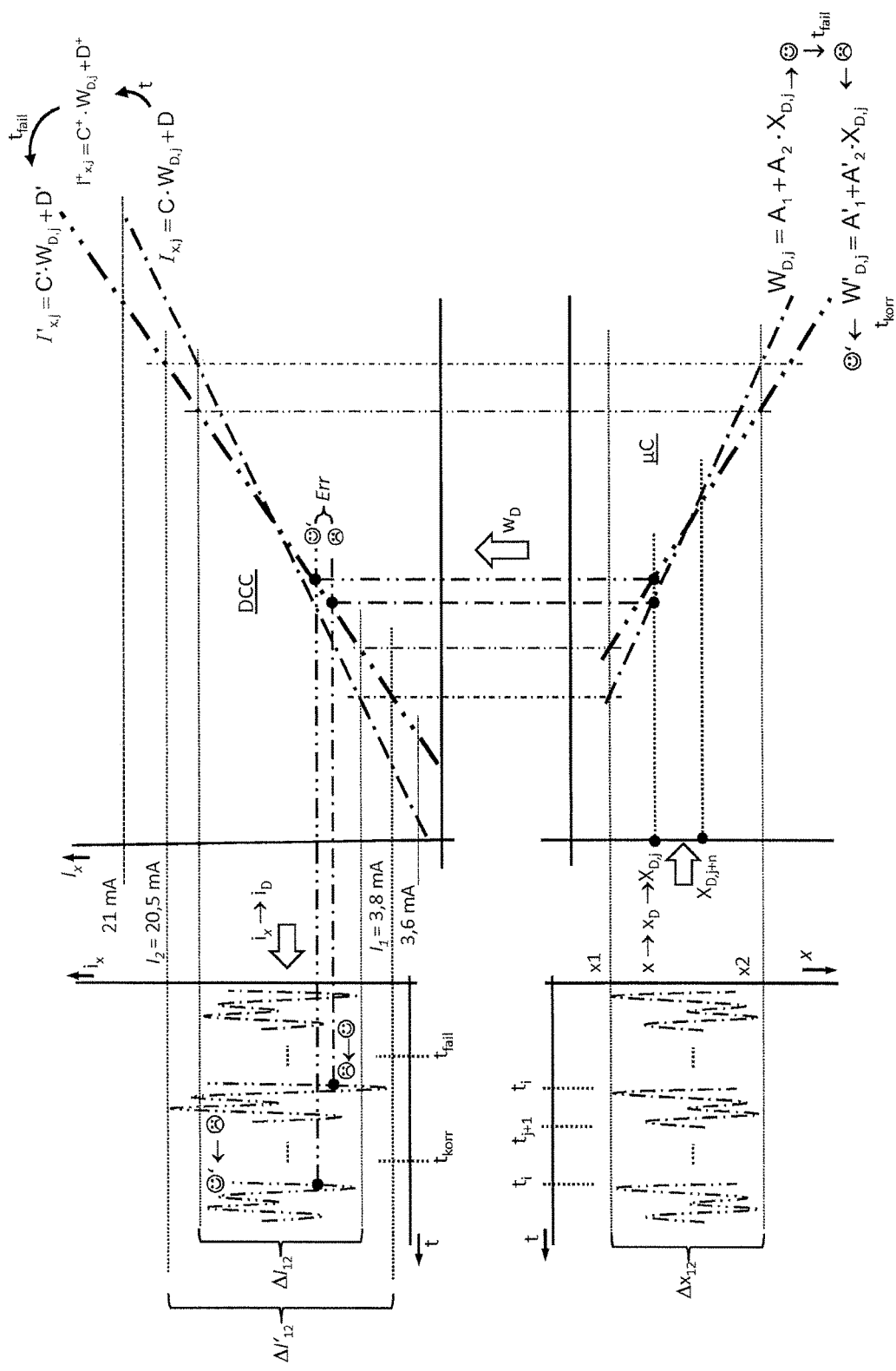
FIG. 4 shows a combination of illustrating time lines and/or characteristic curve diagrams to schematically illustrate the working principle of the converter circuit shown in FIG. 1.

As schematically shown in FIG. 4, the current interface DCC includes a certain characteristic curve function—not least also determined by the operation behavior of individual electronic components or modules the current interface consists of which the current interface uses to translate each current control value ($W_{D,j}=W_{D,0}$) into a corresponding amperage level and/or subject to which each stationary amperage level of the adjusted signal current ix depends on a respective control value at control input $I_{ctrl_{13}in}$. The characteristic curve function of the current interface is ideally a linear one, namely ideally only at first, i.e. at start-up of the installed measuring device, a function determined by the two parameters gradient C and zero point D, approximately like this:

$$I_{x,j}=C \cdot W_{D,j}+D,$$

or may be assumed to be linear at first with sufficient accuracy for the modeling of the respective current interfaces, since in such current interfaces there are regularly also certain dependencies of the actually applied current from the temperature and effective current loads, i.e. dependencies from several influencing variables and/or to a smaller extent also non-linear or temporary dependencies from the current control value.

The micro-processor in turn determines the control values $W_{D,j}$ of the control value sequence as a functional value of a function for at least one of the digital measuring values $X_{D,j}$ of the measuring value sequence, i.e. based on the at least one (momentary) measuring value determined before, as well as a calculation rule with at least two given, currently valid coefficients $A_1, \ldots, A_N$—appropriately saved in the micro-processor μC or saved in the data memory EEPROM. A polynomial function may serve as a calculation $$W_{D,j} = \sum_{k=1}^{N} A_k \cdot X_{D,j}^{k-1} = A_1 + A_2 \cdot X_{D,i} + \ldots + A_N \cdot X_{D,j}^{N-1}$$

rule, for example. The coefficients $A_1, \ldots, A_N$—for which an original set may be set, for example by the manufacturer of the measuring device electronics or the measuring device using it before delivery by calibration with a, potentially accredited, measuring and testing sequence and be stored in a non-volatile data memory such as the EEPROM data memory—are selected in such a way that the respective measuring value $X_{D,j}$ is modified to a previously arranged stationary amperage level that corresponds to it and $$I_{x,j} = C \cdot \left( \sum_{k=1}^{N} A_k \cdot X_{D,j}^{k-1} \right) + D$$

is subject to a general characteristic converter curve for the converter circuit derived from the combination of micro-processor and current circuit overall. In this, it may well be an advantage to at least save the original set of coefficients $A_1, \ldots, A_N$ in the micro-processor and protect it with a password to avoid unintentional deletion of the coefficients $A_1, \ldots, A_N$ and/or allow a reset of the micro-processor to this original set of coefficients $A_1, \ldots, A_N$ at any time.

In one embodiment of the invention, the micro-processor μC is also particularly designed to determine the control values $(W_{D,j})$ of the control value sequence as a linear function of one of the digital measuring values $X_{D,j}$ of the measuring value sequence, i.e. based on a polynomial function governed by two precisely predetermined, currently valid coefficients $A_1, A_2$:

$$W_{D,j} = \sum_{k=1}^{N=2} A_k \cdot X_{D,j}^{k-1} = A_1 + A_2 \cdot X_{D,j},$$

hence a polynomial function of polynomial degree N−1=1, namely in such a way that the characteristic converter curve is defined in the form:

$$I_{x,j}=C \cdot (A_1+A_2 \cdot X_{D,j})+D$$

For current interfaces that are supposed to adjust the signal current proportionally to the measuring value to be signaled, the coefficients are further set in an advantageous way such that the result for each stationary amperage level $I_{x,j}$ of the set signal current $i_x$ fulfills the condition:

$$I_{x,j} = X_{D,j} \cdot \frac{I_2 - I_1}{x_2 - x_1} = X_{D,j} \cdot \frac{\Delta I_{12}}{\Delta x_{12}}$$

during standard operation, i.e. for a measurand x that only changes within the given measuring range $x_{12}$.

As indicated above, the converter circuit Tr is designed to be temporarily—ideally mainly—operated in a normal operation mode in which the measurand x only changes temporarily within the measuring range $\Delta x_{12}$ and in which the micro-processor additionally also issues such control values at the control output $I_{ctrl\_out}$ that cause the current interface DCC to adjust the amperage $I_x$ of the signal current in relation to each measuring value $X_{D,j}$ in such a way that the stationary amperage levels $I_{x,j}$ each found within the measuring span $\Delta I_{12}$, e.g. as schematically shown in FIG. 4, are only adjusted to amperage levels that fall within a measuring span of about 3.8 mA to about 20.5 mA. In addition, the converter circuit is also designed to be operated temporarily in a special operation mode, during which the micro-processor issues, esp. exclusively such control values that cause the current interface to adjust the amperage $I_x$ of the signal current in such a way that the stationary amperage levels $I_{x,j}$ are outside the given measuring span $\Delta I_{12}$, and particularly within a current range that is reserved for alarm messages and/or suggested for this by the NAMUR recommendation NE43:18.01.1994 mentioned above, e.g. below 3.6 mA or over 21 mA. Such switch to a special operation mode for the converter circuit may be caused by a malfunction of the converter circuit diagnosed by the measuring device electronics themselves, or the digital measuring signal and/or caused by a measurand outside the measuring range as diagnosed by the measuring electronics themselves and/or caused by an unacceptably high deviation of at least one of the stationary amperage levels $I_{x,j}$ from the given control value $W_{D,j}$.

In another embodiment of the invention, the converter circuit Tr, or the measuring device electronics ME it is part of, is further designed to occasionally switch automatically from a normal operation mode to the above-mentioned special operation mode in case of a self-diagnosed malfunction of the measurement device electronics or the measurand.

As mentioned above, current interfaces of the type discussed here, not least due to their circuit configuration still realized to a large degree in analogue technology even for modern measuring devices in industrial measuring and automation technology, may tend to slowly and/or successively change their characteristic curve function that is determined by the total of electronic components and modules contributing to the adjustment and/or control of the signal current flow, ultimately a momentary transmission behavior of the individual current interface; in such a way that the current characteristic curve function $I^+_{x,j}=C^+\cdot W_{D,j}+D^+$ used by the current interface to currently adjust the stationary amperage levels Ix,j depending on the digital control values WD,j deviates from the previously identifiable characteristic curve function $I_{x,j}=C\cdot W_{D,j}+D$ for the current interface—e.g. during calibration at the manufacturer's or on site, namely during a (re)calibration of the measuring device electronics during start-up of a measuring device in a facility—possibly due to continued ageing of the electronic components or the modules of the current interface, and in turn changing the entire characteristic curve for the converter, namely:

$$C\cdot\left(\sum_{k=1}^{N} A_k \cdot X_{D,j}^{k-1}\right)+D \to C^+\cdot\left(\sum_{k=1}^{N} A_k \cdot X_{D,j}^{k-1}\right)+D^+ \text{ and/or}$$

$$C\cdot(A_1+A_2\cdot X_{D,j})+D \to C^+\cdot(A_1+A_2\cdot X_{D,j})+D^+$$

and thus also the above-mentioned—here proportional—connection between an identified measuring value $X_{D,j}$ and the currently set amperage level $I_{x,j}$, for it, namely:

$$X_{D,j}\cdot\frac{\Delta I_{12}}{\Delta x_{12}} \to X_{D,j}\cdot\frac{\Delta I^+_{12}}{\Delta x_{12}}.$$

Hence the calculation rule (☺) that was precisely adapted to the previously correct characteristic curve function for the current interface DCC fits the control values for the current interface DCC controlled by them less and less as it has since changed its transmission behavior. With the continuing process of such modifications in the characteristic curve function, this may lead to a discrepancy between the current calculation rule and the current characteristic curve function that continues to grow, and to a consequent increase in the deviation between a control value $W_{D,j}$ and the stationary amperage level $I_{x,j}$, namely a deviation between a measuring value $W_{D,j}$ and the corresponding stationary amperage level $I_{x,j}$ which at a certain point in time $t_{fail}$—not regularly predictable or identifiable ☺ becomes unacceptable. The result of this deviation is that the currently valid calculation rule no longer fits the current characteristic curve function of the current interface DCC (☺) because the control values determined on this basis actually lead to a conversion error Err, i.e. a discrepancy between the measuring value displayed with the actually set stationary amperage level $I_{x,j}$ and measuring value $X_{D,j}$ underlying the corresponding control value $W_{D,j}$, which may be unacceptably high, and potentially should be reported and/or corrected. The converter error Err may, for example, be specified using the formula:

$$Err = X_{D,j}\cdot\frac{\Delta I'_{12}}{\Delta x_{12}} - X_{D,j}\cdot\frac{\Delta I_{12}}{\Delta x_{12}}$$

for a quantitative expression. At this point $t_{fail}$ then, the calculation rule—originally sufficiently accurate for the current interface—must be assumed to be unsuitable for the calculation rule for the time being with regard to the current interface and/or its current characteristic curve function $C\cdot W_{D,j}+D \to C'\cdot W_{D,j}+D'$, and hence the signal current $I_{x,j}$ $I'_x$, delivered by the converter circuit according to its current characteristic converter curve:

$$I_{x,j}=C'\cdot\left(\sum_{k=1}^{N} A_k\cdot X_{D,j}^{k-1}\right)+D' \to I'_{x,j},$$

must be regarded as currently incorrect (☺).

For the converter circuit Tr according to the invention, and thus for the measuring device according to the invention incorporating it, it has therefore been proposed to detect regular changes—not least due to the continued operation time and ageing of the current interface DCC—in the characteristic curve function for the current interface DCC at an early stage and report it if necessary and/or compensate for it appropriately by a suitable implementation of an adjusted calculation rule for the control values via the micro-processor µC and the current interface DCC themselves. For this purpose, the micro-processor µC features a current signal input $I_{D\_in}$ electrically connected to the current signal output $I_{D\_out}$ of the current interface DCC. At the same time, the micro-processor µC of the converter circuit Tr according to the invention is arranged to check the current interface occasionally, esp. in regular intervals based on the control value sequence $w_D$ and the current value sequence $i_{D\_in}$,—read in via current signal input $I_{D\_in}$—, and at least temporarily determine, whether the current characteristic curve function fits the currently valid calculation rule (☺) for the identification of the control values, i.e. the one executed by the micro-processor µC to generate the control values or whether, for example, the transmission behavior of the current interface DCC has meanwhile changed so drastically that the converter error Err is unacceptably high, and should be reported and/or corrected, and hence the currently valid calculation rule no longer fits the current characteristic line function of the current interface DCC (☺), hence to monitor the current interface and/or its functional efficiency.

Said monitoring or checking of the current interface DCC may be effected by using the micro-processor μC to determine a deviation between a control value $W_{D,j}$ currently representing an amperage level to be adjusted by the current interface DCC and at least one respective digital current value $I_{D,j}$, possibly with regular repetition and then deciding whether the deviation found is within or outside a tolerance range given for acceptable deviations, and/or by using the micro-processor μC to calculate to what extent or by what percentage said current value $I_{D,j}$ deviates from the control value $W_{D,j}$, and thus from the measuring value $X_{D,j}$ represented by it. Alternatively or as a complement, the current parameters gradient C' and zero point D' of the—current—characteristic curve function of the current interface can be identified at least approximately on the basis of two or more value pairs each consisting of a control value $W_{D,i}$ and a corresponding current value $I_{D,j}$ using the micro-processor μC and then be compared with previously identified reference values C, D saved, for example, in the persistent data memory EEPROM, to determine, for instance, whether or to what extent said current characteristic curve function deviates from a characteristic curve function for the current interface DCC previously determined e.g. during a calibration process at the manufacturer's.

Since such a check for the current interface DCC cannot be regarded as time sensitive compared to a repetition rate—in the range of a couple of milliseconds—for the generation of the actual measured values and/or the control values in the micro-processor, and may thus be extended over a much longer period of time, e.g. even over a couple of minutes, testing the converter circuit may at first be executed during normal operation mode without causing problems, e.g. in such a way that first the value pairs monitored by the micro-processor and consisting of a control value $W_{D,i}$ and respective corresponding current value $I_{D,j}$ are saved, at least temporarily in the data memory EEPROM, i.e. at least until the end of the testing underway and then used to determine the characteristic curve function as mentioned above. In this, it may well be advantageous to save the control value and at least one corresponding digital current value, hence at least the one value pair consisting of those two values in the data memory EEPROM together with a time stamp, i.e. a time value that corresponds to the time of saving. The value pairs that may be saved with a corresponding time stamp and/or the deviations or converter errors Err identified between their current values and each corresponding control value may, for example, also be displayed using the display unit HMI on site, e.g. upon a suitable control command sent to the micro-processor and/or saved in the non-volatile data memory EEPROM, possibly also together with a corresponding time stamp.

Considering the fact that the characteristic curve function of the current interface DCC typically only changes very slowly over time, also compared to the above-mentioned repetition rate for the measuring values and compared to typical modification rates of the measurand to be identified, it may well be sufficient if a test of the current interface is only executed occasionally, e.g. on a regular interval basis and/or when needed. On the other hand, it is also possible to have the current signal output $I_{D\_out}$ of the current interface in a version that can be switched on or off in such a way that the current interface only issues the current value sequence $i_D$ at the current signal output $I_{IST\_out}$ after receipt of a control command ON that adds, or activates the current signal output $I_{IST\_out}$ or, reversed, that the current interface for a certain interval, e.g. when the control command ON is not received, does not issue a current value sequence $i_D$ at the current signal output $I_{D\_out}$. For this purpose, the analogue-to-digital converter ADC that forms the current output may also be switched off completely, e.g. to temporarily lower the useful voltage needed for the operation of the converter circuit and/or to keep the operation time that contributes to ageing behavior of said analogue-to-digital converter ADC as low as possible. Keeping this in mind, it may also prove to be advantageous to maintain an activation time, i.e. the cumulated total time over a given operation period during which the current interface issues the current value sequence $i_D$ at the current signal output $I_{D\_out}$ shorter than a deactivation time, i.e. the cumulated total time over a given operation period during which the current interface does not issue the current value sequence $i_D$ at the current signal output $I_{D\_out}$. According to a further embodiment of the invention, the current interface correspondingly also features a release input EN as schematically indicated in FIG. 1, and the micro-processor features a release output $I_{out\_ctrl}$ connected to said release input of the current interface. The current interface furthermore is designed in such a way that the current value sequence $i_D$ is issued at the current signal output $I_{IST\_out}$ once a control command ON that activates the current signal output $I_{IST\_out}$ is applied to the release input EN. In a corresponding manner, the micro-processor is furthermore designed to occasionally generate a control command to activate the current signal output $I_{IST\_out}$ and issue it at the release output $I_{out\_ctrl}$. In addition, the current interface is designed not to issue a current value sequence $i_D$ at the current signal output $I_{D\_out}$ if there is no activating control command ON applied to the release input EN, or after a control command OFF deactivating the current signal output $I_{D\_out}$ is applied to the release input EN. For use in the latter case, the micro-processor may furthermore be designed in such a way that it occasionally also generates a control command to deactivate the current signal output $I_{D\_out}$ and issues it at the release output $I_{out\_ctrl}$. Alternatively, or as a complement to the temporary deactivation of the current output and/or switching off of the analogue-to-digital converter ADC creating it, the useful voltage required for the operation of the converter circuit may also temporarily be lowered by only temporarily assigning a higher work cycle rate compared to the normally assigned basic cycle rate to control said analogue-to-digital converter ADC during a test run of current interface DCC, for example.

In case it is occasionally noted during a test run by the micro-processor μC during operation to check the current interface DCC that the currently valid calculation rate no longer fits the current character curve function for the current interface DCC, (☺), which cannot be excluded as such, and that therefore the point in time $t_{fail}$ has been shown to have been exceeded, this may at first be reported, also on site using the above-mentioned display element HMI to first demonstrate the need for an appropriate correction before adjusting the converter circuit. Alternatively or as a complement, the characteristic converter curve may also be corrected based on the control values generated by the micro-processor and then on the basis of the current values issued by the current interface and read by the micro-processor, to thus minimize the converter error Err accordingly. The micro-processor μC in another embodiment of the invention is therefore further designed to adjust the calculation rule for the control values to the current characteristic curve function for the current interface DCC and thus to reduce the converter error Err again—namely from a point in time $t_{korr}$, based on the control value sequence $w_D$ and the current value sequence $i_D$, and esp. based on saved control values $W_{D,j}$ as well as saved digital current values $I_{D,j}$, and ideally in such a way, that a deviation of the current characteristic curve function from a previously determined characteristic curve function for the current interface is compensated almost completely and the converter error Err is practically eliminated.

For the purpose of a correction of the characteristic converter curve, provision is made in another embodiment of the invention for the micro-processor μC to determine at least one replacement coefficient $A'_M$ for at least one of the currently valid and still to be replaced coefficients $A_M \in \{A_1, \ldots, A_N\}$ once an unacceptably high deviation of a stationary amperage level $I_{x,j}$ from the control value $W_{D,j}$ set for this value is identified, and therefore an unacceptably large converter error Err and/or the point in time $t_{fail}$ was exceeded. This especially in such a way that the characteristic converter curve (☺') that has been corrected, i.e. newly adjusted using the calculation rule that now is also governed by at least one replacement coefficient $A'_M \rightarrow A_M$ corresponds as much as possible to the original characteristic converter curve, and therefore the following applies for the corrected and/or the original characteristic converter curve:

$$C \cdot (A'_1 + A'_2 \cdot X_{D,j}) + D' = C \cdot (A_1 + A_2 \cdot X_{D,j}) + D$$

At least one replacement coefficient is—like the now replaced coefficient—saved as non-volatile data, e.g. in the data memory EEPROM and is thus available for the micro-processor. Said saving of the replacement coefficient may also once more be done with an appropriate time stamp. For the correction of the characteristic converter curve causing unacceptably large converter errors Err, the micro-processor according to another embodiment of the invention is furthermore arranged in such a way that it first identifies two different control values $W_{D,j}$ and/or $W_{D,j+n}$ according to the current calculation rule governed by the currently valid coefficients $A_1, \ldots, A_N$, which nevertheless no longer fit the current interface, and issues them at the control output $I_{ctrl\_out}$ at different times $t_j$ and/or $t_{j+n}$. Furthermore the micro-processor calculates digital current values $I_{D,j}$ and $I_{D,j+n}$ representing the actually set stationary amperage level for the control values $W_{D,j}$ and/or $W_{D,j+n}$ generated accordingly by the current interface and based on the current value sequence $I_{D\_out}$ at the current signal output $I_{D\_out}$ during the issuing of the control values $W_{D,j}$ and/or $W_{D,j+n}$ at control output $I_{ctrl\_out}$. Based on the at least two control values $W_{D,j}$ and/or $W_{D,j+n}$ and the at least two digital current values $I_{D,j}$ and $I_{D,j+n}$, the micro-processor finally identifies at least one replacement coefficient $A'_M$ for at least one of the currently valid, but to be replaced coefficients $A_M \in \{A_1, \ldots, A_N\}$ to then, namely from the point in time $t_{korr}$ that saw execution of the calculation rule modification generate the control value sequence $w_D$ using the at least one replacement coefficient $A'_M \rightarrow A_M$ instead of the coefficient $A_M$ to be replaced.

For the typical case that on the one hand the momentary characteristic line function mainly corresponds to a linear function, and is therefore approximated in the formula $I_{x,j} = C \cdot W_{D,j} + D$ with sufficient approximation, and that on the other hand the calculation rule corresponds to a polynomial function of polynomial degree One (N=2), and hence only two replacement coefficients $A'_1, A'_2$ have to be identified in order to correct the characteristic converter curve and/or adjust the calculation rule for the control values to the current characteristic curve function of the current interface, the calculation of the replacement coefficient $A'_2 \rightarrow A_2$ may be realized with the micro-processor μC according to the following calculation rule:

$$A'_2 = A_2 \cdot \frac{W_{D,j+n} - W_{D,j}}{I_{D,j+n} - I_{D,j}} \quad (n > 0 \ \& \ W_{D,j} \neq W_{D,j+n})$$

and/or the calculation of the replacement coefficient $A'_1 \rightarrow A_1$ may be realized by the micro-processor μC according to the following calculation rule:

$$A'_1 = A_1 - \frac{1 - \frac{I_{D,j+n} - I_{D,j}}{W_{D,j+n} - W_{D,j}}}{1 - \frac{I_{D,j}}{W_{D,j}}} = A_1 - \frac{1 - \frac{A_2}{A'_2}}{1 - \frac{I_{D,j}}{W_{D,j}}}$$

$(n > 0 \ \& \ W_{D,j} \neq W_{D,j+n})$.

In case the measurand x remains stationary over longer periods of time, or is very slow compared to the above-mentioned repetition rate used for the generation of the actual measured values and/or the control values in the micro-processor, the calculation of the above-mentioned replacement coefficients $A'_M$ ($A'_1, A'_2, \ldots$) may conveniently occur during the normal operating mode of the converter circuit Tr. In another case that the measurand x typically fluctuates massively or is at most only stationary in an unpredictable way or only for a very short time, it may also be quite necessary to cause the converter circuit Tr to switch from normal operating mode to a special operating mode to identify the replacement coefficient $A'_M$ once the need for a modification of the calculation rule has been diagnosed. Said switch from normal to special operating mode may, for example, be externally controlled, e.g. by a control command transferred to the micro-processor via the display and control element HMI or alternatively also automatically, i.e. through the micro-processor itself once a corresponding result of the diagnosis is received and without waiting for another external control command. In order to determine at least one replacement coefficient $A'_M$, two or more control values that deviate from one another may be issued by the micro-processor μC, each of which causes the current interface DCC to adjust the amperage $I_x$ of the signal current in such a way that the corresponding stationary amperage level $I_x$ is outside the measuring span $\Delta I_{12}$, and hence below the lower of the two limit amperages of the measuring span, or over the higher of the two limit amperages of the measuring span, e.g. 3.6 mA or less and/or 21 mA or more.

For the converter circuit according to the invention and/or the measuring electronics including said converter circuit, another option for checking the characteristic curve function of the current interface, the calculation rule for the control values and/or the characteristic converter curve on site is also during the (first) startup in the plant after the respective measuring device has been installed, or during a (renewed) start-up after restarting the micro-processor. This offers the advantage that during this time the system has to be verified or controlled anyway without using the measuring device that the measuring electronics to be tested are part of, and therefore no further, potentially unplanned disruption of the operation in the rest of the system is required. Accordingly, the converter circuit according to another embodiment of the invention is designed to be operated in a start-up mode in which the micro-processor is first started and then the current interface checked with the micro-processor. During start-up mode, the current interface can very easily be tested using the micro-processor, naturally after the latter has been restarted, by first using a live-zero-control value at the control output at a point in time $t_j$, said control value causing the current interface to adjust the amperage $I_x$ of the signal current in such a way that the corresponding stationary amperage level $I_{x,j}$ corresponds to an amperage signaling the live-zero-value (live zero point of the converter circuit), as well as at a later time $t_{j+n}$, esp. after the micro-processor has read in at least one digital current value corresponding to the life-zero-control value, a control value deviating from the live-zero-control value causing the current interface to adjust the amperage $I_x$ of the signal current in such a way that the issued corresponding stationary amperage level $I_{x,j+n}$ corresponds to a current value above the live-zero-value, for example also to an alarm current value of more than 20.5 mA and less than 23 mA, and by using the life-zero-control value, at least one digital current value corresponding to said live-zero-control value, the control value deviating from the live-zero-control value and at least one digital current value corresponding to said control value to identify the current characteristic curve function and comparing it with the originally given characteristic curve function. As an alternative or a complement, a deviation between the live-zero-control value and the corresponding digital current value $I_{D,j}$, as well as a deviation between the other control value deviating from the live-zero-control value and the corresponding digital current value $I_{D,j+n}$ can be identified for the purpose of checking the current interface with the micro-processor. Then, the current interface can be tested by using the micro-processor to determine whether each of the two deviations found are within or outside the above-mentioned tolerance range representing acceptable deviations.

The invention claimed is:
1. A converter circuit transforming a digital measuring signal representing a temporal course of a changing physical and/or chemical measurand into an analogue measure value signal dependent on said digital measuring signal, said analogue measure value signal exhibiting a signal current, whereby an amperage of said signal current represents a measuring value for the measurand; said converter circuit comprising:
  a current interface, with a control input, with a current signal output, and with a current output; and a micro-processor with a measuring signal input for the digital measuring signal, with a current signal input connected to the current signal output of the current interface, and with a current signal output connected to the current signal output of the current interface;
  said current interface being configured for letting the signal current flow through the current output while adjusting the amperage of the signal current to a current value currently applied to the control input to an appropriate stationary amperage level in such a way as to make each of the stationary amperage levels dependent on a respective control value as determined by a characteristic curve function of the current interface as well as for outputting at the current signal output a current value sequence, said current value sequence representing a temporal course of the signal current amperage and said current value sequence being a sequence of digital current values representing the current amperage for different points in time;
  said micro-processor being adapted to generate, based on the digital measuring signal at the measuring signal input, a measuring value sequence, said measuring value sequence representing a temporal course of the measurand for different points in time and said measuring value sequence being a sequence of digital measuring values each momentarily representing the measurand in turn, as well as to output a control value sequence at the control output based on the measuring value sequence, said control value sequence being a sequence of digital control values for the current interface; and
  said micro-processor being adapted to monitor and/or check the current interface based on the control value sequence and the current value sequence.

2. The converter circuit according to claim 1, further comprising:
  a volatile data memory to save digital measured values and/or digital control values, with the micro-processor being set to temporarily save digital control values, as well as digital current values in the data memory.

3. The converter circuit according to claim 1, wherein:
  said micro-processor is adapted to check the current interface based on the control value sequence and the current value sequence, namely: to determine a deviation between a control value and at least one corresponding digital current value and/or to determine to what extent said current value deviates from said control value and/or to determine a current characteristic curve function according to which the current interface adjusts said stationary amperage levels in relation to said digital control values and/or to determine whether or to what extent a current characteristic curve function used by said current interface to adjust the stationary amperage levels subject to said digital control values deviates from a previously determined characteristic curve function determined for the current interface.

4. The converter circuit according to claim 1, wherein:
  the current interface includes a release input and the micro-processor includes a release output connected to said release input of the current interface; and whereby the current interface is adapted to output the sequence of current values on the current signal output after a control command has been applied to the release input that activates the current signal output, and the micro-processor is adapted to generate control command to activate the current signal output and issue it at the release output.

5. The converter circuit according to claim 4, wherein:
  the current interface is adapted to temporarily not issue a sequence of current values at the current signal output.

6. The converter circuit according to claim 5, wherein:
  the current interface is adapted not to issue a sequence of current values at the current signal output after a deactivating control command is applied to the release input; and
  the micro-processor is adapted to generate a control command to deactivate the current signal output and issue it at the release output.

7. The converter circuit according to claim 1, wherein:
  the converter circuit is adapted to be operated in a normal operation mode over some time, during which normal operation mode the measurand is modified only over time within a pre-determined measuring range, with a minimum range limit, for the pre- set measuring value for measurand and a determined maximum range limit, pre-set by the determined highest measuring value for measurand, and during which normal operation mode the micro-processor only outputs control values at the control output which cause the current interface to adjust the amperage of the signal current in such a way that the stationary amperage levels are each found within a pre-set measuring range, that is pre-set in that it corresponds with the measuring range for the measurand, therefore having a first limit current value, corresponding to the minimum range threshold, and a second limit current value, corresponding to the maximum range threshold, which differs from the first limit current value.

8. The converter circuit according to claim 7, wherein: the first limit current value is 4 mA or less.

9. The converter circuit according to claim 7, wherein: the second limit current value is 20 mA or more.

10. The converter circuit according to claim 7, wherein: the converter circuit is adapted to be operated in a special operating mode for at least some of the time, during which special operation mode the micro-processor outputs such control values at the control output that cause the current interface to adjust the amperage of the signal current in such a way that the stationary amperage levels are outside the pre-set measuring range.

11. The converter circuit according to claim 10, wherein: the converter circuit is adapted to switch from normal operation mode to special operation mode.

12. The converter circuit according to claim 10, wherein: the micro-processor is adapted to output a control value at the control output to determine at least one replacement coefficient, with said control value causing the current interface to adjust the amperage of the signal current to a stationary amperage level that is lower than the lower of the two limit amperages of the measuring range; and/or
the micro-processor is adapted to output a control value at the control output to determine at least one replacement coefficient, with said control value causing the current interface to adjust the amperage of the signal current to a stationary amperage level that is higher than the higher of the two limit amperages of the measuring range.

13. The converter circuit according to claim 10, wherein: the micro-processor is adapted to switch automatically from a normal operating mode to said special operating mode.

14. The converter circuit according to claim 10, wherein: the micro-processor is adapted to switch controlled externally from a normal operating mode to said special operating mode.

15. The converter circuit according to claim 7, wherein: the converter circuit is adapted to be operated in a start-up mode that starts up the micro-processor.

16. The converter circuit according to claim 15, wherein: the micro-processor is designed to check the current interface during start-up mode.

17. The converter circuit according to claim 15, wherein: the micro-processor is adapted to check the current interface during start-up mode by issuing a live-zero-control value at the control output, namely a control value that causes the current interface to adjust amperage of the signal current in such a way that the corresponding stationary amperage level relates to a live-zero-value, namely an amperage signaling the live zero point of the converter circuit corresponding to the lowest of the two limit amperages.

18. The converter circuit according to claim 17, wherein: the micro-processor is adapted to check automatically the current interface during start-up mode by issuing a control value that deviates from the live-zero-control value causing the current interface to adjust the amperage of the signal current in such a way that the corresponding stationary amperage level relates to a current value above the lowest of the two limit amperages.

19. The converter circuit according to claim 18, wherein: the micro-processor is adapted to check the current interface during start-up mode automatically, by using the live-zero-control value, a digital current value corresponding to the live-zero-control value, the control value deviating from the live- zero-control value, as well as at least one digital current value corresponding to said digital current value to determine a current characteristic curve function that regulates the adjustment of the stationary amperage levels subject to the digital control values by the current interface and by comparing said current characteristic curve function with a pre-set characteristic curve function; and/or
the micro-processor is adapted to check the current interface during start-up mode automatically by determining both, a deviation between the live-zero-control value and the respective digital current value and a deviation between the other control value deviating from the live-zero-control value and the respective digital current value, and by determining whether each of the deviations found is within or outside a tolerance range representing admissible deviations.

20. The converter circuit according to claim 1, wherein: the micro-processor is adapted to determine a transducer error based on the sequence of control values and the sequence of current values, esp. based on the saved control values, as well as the saved digital current values.

21. The converter circuit according to claim 1, wherein: the micro-processor is adapted to determine the control values of the control value sequence based on a calculation rule determined by at least two pre-set, currently valid coefficients $(A_1, \ldots, A_N)$ according to a polynomial function $$W_{D,j} = \sum_{k=1}^{N} A_k \cdot X_{D,j}^{k-1} = A_1 + A_2 \cdot X_{D,i} + \ldots + A_N \cdot X_{D,j}^{N-1}$$

as the functional value of an function of at least one of the digital measuring values of the sequence of measuring values.

22. The converter circuit according to claim 21, wherein: the micro-processor is adapted to adjust, based on the sequence of control values and the sequence of current values, said calculation rule to a current characteristic curve function used by the current interface to adjust the stationary amperage levels subject to the digital control values.

23. The converter circuit according to claim 22, wherein: the micro-processor is adapted to adjust said calculation rule to a current characteristic curve function such that a deviation of the current characteristic curve function from a previously determined characteristic curve function for the current interface is compensated.

24. The converter circuit according to claim 21, wherein:
the micro-processor is adapted to occasionally determine at least one replacement coefficient ($A'_M$) for at least one of the currently valid but still to be replaced coefficients ($A_M \in \{A_1, \ldots, A_N\}$).

25. The converter circuit according to claim 24, wherein:
the converter circuit is adapted to be operated in a special operating mode for at least some of the time, during which special operation mode the micro-processor outputs such control values at the control output that cause the current interface to adjust the amperage of the signal current in such a way that the stationary amperage levels are outside a pre-set measuring range, and the micro-processor is adapted to determine the replacement coefficient in said special operating mode.

26. The converter circuit according to claim 25, wherein:
the micro-processor is adapted to switch from a normal operating mode to said special operating mode in order to determine the replacement coefficient.

27. The converter circuit according to claim 25, wherein:
the micro-processor is adapted to determine the replacement coefficient in said special operating mode in such a way that for the determination of at least the replacement coefficient at least two different control values are issued by the micro-processor, at least one of which causes the current interface to adjust the amperage of the signal current in such a way that the respective stationary amperage level is below the lowest of the two limit amperages, and/or at least one of which causes the current interface to adjust the amperage, of the signal current in such a way that the respective stationary amperage level is higher than the higher of the two limit amperages.

28. The converter circuit according to claim 24, further comprising:
a persistent data memory, wherein: the micro-processor is adapted to store said at least one replacement coefficient within said persistent data memory.

29. The converter circuit according to claim 21, wherein:
the micro-processor is designed to determine at least one replacement coefficient ($A'_M$) for at least one of the currently valid but nonetheless to be replaced coefficients ($A_M \in \{A1, \ldots, A_N\}$), based on a first control value ($W_{D,j}$) determined by the calculation rule governed by a calculation rule corresponding to said momentarily valid coefficients ($A_1, \ldots, A_N$), issued at the control output and valid at least at a first point in time ($t_j$) and at least one first digital current value ($I_{D,j}$) issued by the current interface at its current signal output and based on at least one second control value ($W_{D,j+1}$) issued at control output compliant with the calculation rule determined by said momentarily valid coefficients ($A_1, \ldots, A_N$) and valid at a second point in time ($t_{j+n}$) which differs from the first control value ($W_{D,j}$) and at least one second digital current value ($I_{D,j+n}$) issued by the current interface at its current signal output.

30. The converter circuit according to claim 29, wherein:
the micro-processor is designed to generate a control value sequence using the at least one replacement coefficient instead of the coefficient to be replaced.

31. The converter circuit according to claim 29, wherein:
the micro-processor is designed to determine,
a replacement coefficient ($A'_1$) for a first coefficient ($A_1 \in \{A_1, \ldots, A_N\}$) to be replaced compliant with a first calculation rule for replacement coefficients, using a first control value ($W_{D,j}$) and the first digital current value ($I_{D,j}$) as well as the second control value ($W_{D,j+1}$) and the second digital current value ($I_{D,j+n}$):

$$A'_1 = A_1 - \frac{1 - I_{D,j+n} - I_{D,j}}{1 - \frac{I_{D,j}}{W_{D,j}}} = A_1 - \frac{1 - \frac{A_2}{A'_2}}{1 - \frac{I_{D,j}}{W_{D,j}}} (n > 0 \ \& \ W_{D,j} \neq W_{D,j+n}),$$

as well as a replacement coefficient ($A'_2$) for a second coefficient to be replaced ($A_2 \in \{A_1, \ldots, A_N\}$) as per a second calculation rule for a replacement coefficient:

$$A'_2 = A_2 \cdot \frac{W_{D,j+n} - W_{D,j}}{I_{D,j+n} - I_{D,j}} (n > 0 \ \& \ W_{D,j} \neq W_{D,j+n});$$

and then generate the control value sequence ($w_D$) using both the first replacement coefficient ($A'_1 \rightarrow A_1$) instead of the first coefficient ($A_1$) to be replaced and using the second replacement coefficient ($A'_2 \rightarrow A_2$) instead of the second coefficient ($A_2$) to be replaced.

32. The converter circuit according to claim 1, wherein:
the converter circuit is adapted to at least occasionally check, based on the sequence of control values and the sequence of current values, whether a stationary amperage level corresponds to the respective pre-set control value and/or to what extent a stationary amperage level deviates from the control value set.

33. The converter circuit according to claim 1, wherein:
the micro-processor is designed to determine the control values ($W_{D,j}$) of the control value sequence as a linear function of one of the digital measuring values ($X_{D,j}$) of the measuring value sequence based on a polynomial function $$W_{D,j} = \sum_{k=1}^{N=2} A_k \cdot X_{D,j}^{k-1} = A_1 + A_2 \cdot X_{D,ij}$$

of polynomial degree N-1=1 governed by two precisely predetermined, currently valid coefficients ($A_1$, $A_2$).

34. The converter circuit according to claim 1, further comprising:
a persistent data memory.

35. A measuring device, comprising:
a measuring sensor to capture a physical and/or chemical measurand changing over time and to generate at least one analogue measuring signal representing the temporal course of said measurand; a well as measuring device electronics electrically coupled to the sensor and adapted to convert the analogue measuring signal in a digital measuring signal representing said analogue measuring signal and, consequently, a temporal course of said measurand, wherein the measuring device electronics includes a converter circuit according to claim 1.

36. The measuring device according to claim 35, wherein:
the measuring device electronics includes:
a first connecting terminal adapted to be electrically connected to a first conduit external from the converter circuit; and
a second connecting terminal adapted to be electrically connected to a first conduit external from the converter circuit.

37. The measuring device according to claim 36, wherein:
the current output of the current interface includes two connecting electrodes, of which connecting electrodes a first connecting electrode is connected electrically to the first connecting terminal and a second connecting electrode connected to the second connecting terminal.

38. The measuring device according to claim 36, further comprising:
a display element controlled by the micro-processor to display measured values generated by the micro-processor and to display a pair of values consisting of a current value and a control value and/or a deviation of a current value from a control value and/or to display a transducer error.

39. The measuring device according to claim 36, further comprising:
a third connecting terminal adapted to be electrically connected to a third conduit external from the converter circuit; and
a fourth connecting terminal adapted to be electrically connected to a fourth conduit external from the converter circuit.

40. The measuring device according to claim 39, wherein:
the voltage input of the energy supply circuit comprises two connecting electrodes, of which connecting electrodes the first connecting electrode is connected to the third connecting terminal and a second connecting electrode to the fourth connecting terminal.

41. The measuring device according to claim 35, wherein:
said measuring device electronics further comprise an energy supply circuit with an input and at least one output, said energy supply circuit being adapted to supply a useful voltage at said output to operate the micro-processor and/or to operate the current interface.

42. The measuring device according to claim 41, wherein:
the energy supply circuit is designed to carry at least a part of the signal current and use it to supply the useful voltage to operate the micro-processor and/or operate the current interface.

43. The converter circuit according to claim 1, wherein:
the micro-processor is adapted to monitor and/or check the current interface based on the control value sequence and the current value sequence based on at least temporarily saved control values as well as at least temporarily saved digital current values.

44. The converter circuit according to claim 1, wherein:
the micro-processor is adapted to monitor and/or check the current interface based on a deviation between a control value and at least determine one respective digital current value.

45. The converter circuit according to claim 1, wherein:
the micro-processor is adapted to monitor and/or check the current interface by determining to what extent a current value deviates from its corresponding control value.

46. The converter circuit according to claim 1, wherein:
the micro-processor is adapted to monitor and/or check the current interface by determining a current characteristic curve function used by the current interface to adjust stationary amperage levels depending on the digital control values.

47. The converter circuit according to claim 1, wherein:
the micro-processor is adapted to monitor and/or check the current interface by determining if or to what extent a current characteristic curve function used by the current interface to adjust stationary amperage levels deviates from an earlier characteristic curve function of the current interface.

* * * * *